United States Patent
Machii et al.

(10) Patent No.: US 6,786,945 B2
(45) Date of Patent: Sep. 7, 2004

(54) POLISHING COMPOUND AND METHOD FOR POLISHING SUBSTRATE

(75) Inventors: Youichi Machii, Tsuchiura (JP); Naoyuki Koyama, Hitachi (JP); Masaya Nishiyama, Tsukuba (JP); Masato Yoshida, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/467,864

(22) PCT Filed: Feb. 20, 2002

(86) PCT No.: PCT/JP02/01483

§ 371 (c)(1),
(2), (4) Date: Aug. 13, 2003

(87) PCT Pub. No.: WO02/067309

PCT Pub. Date: Aug. 29, 2002

(65) Prior Publication Data

US 2004/0065022 A1 Apr. 8, 2004

(30) Foreign Application Priority Data

| Feb. 20, 2001 | (JP) | 2001-044252 |
| Jun. 28, 2001 | (JP) | 2001-197274 |
| Nov. 15, 2001 | (JP) | 2001-350598 |
| Dec. 12, 2001 | (JP) | 2001-378838 |
| Dec. 28, 2001 | (JP) | 2001-400866 |
| Dec. 28, 2001 | (JP) | 2001-400872 |
| Dec. 28, 2001 | (JP) | 2001-400876 |
| Dec. 28, 2001 | (JP) | 2001-400882 |
| Dec. 28, 2001 | (JP) | 2001-400888 |
| Dec. 28, 2001 | (JP) | 2001-400891 |

(51) Int. Cl.⁷ .......................... C09G 1/02; C09G 1/04; B24B 1/00
(52) U.S. Cl. .............. 51/307; 51/309; 106/3; 438/692; 438/693
(58) Field of Search ............ 51/307, 309; 106/3; 438/692, 693

(56) References Cited

U.S. PATENT DOCUMENTS

| 3,097,083 A | * | 7/1963 | Silvernail | 51/307 |
| 3,123,452 A | * | 3/1964 | Harris et al. | 51/307 |
| 3,761,571 A | * | 9/1973 | Woodhead | 423/263 |
| 5,759,917 A | * | 6/1998 | Grover et al. | 438/690 |
| 6,248,395 B1 | * | 6/2001 | Homola et al. | 427/129 |
| 6,379,406 B1 | * | 4/2002 | Thomas et al. | 51/309 |
| 6,689,692 B1 | * | 2/2004 | Grover et al. | 438/691 |

FOREIGN PATENT DOCUMENTS

| JP | 09-270402 | 10/1997 |
| JP | 10-106986 | 4/1998 |
| JP | 11-135467 | 5/1999 |
| JP | 2000-053946 | 2/2000 |
| JP | 2000-192015 | 7/2000 |
| JP | 2001-077061 | 3/2001 |
| JP | 2001-192647 | 7/2001 |
| JP | 2001-348563 | 12/2001 |
| JP | 2002-097459 | 4/2002 |

* cited by examiner

Primary Examiner—Michael Marcheschi
(74) Attorney, Agent, or Firm—Antonelli, Terry, Stout & Kraus, LLP (57) ABSTRACT

A polishing slurry and a polishing method which are suitably used in a CMP technique for flattening a surface of a substrate in a production process of a semiconductor device. The polishing slurry comprises particles and a medium in which at least a part of the particles are dispersed, wherein the particles are made of at least one of (1) a cerium compound selected from cerium oxide, cerium halide and cerium sulfide and having a density of 3 to 6 g/cm³ and an average particle diameter of secondary particles of 1 to 300 nm and (2) a tetravalent metal hydroxide. A polishing method using the polishing slurry takes advantage of a chemical action of particles in the polishing slurry and minimizes a mechanical action of the particles, thereby achieving a decrease in scratches caused by the particles and an increase in polishing rate at the same time.

44 Claims, 2 Drawing Sheets

POLISHING COMPOUND AND METHOD FOR POLISHING SUBSTRATE

TECHNICAL FIELD

The present invention relates to a polishing slurry which is suitably used in a technique for producing a semiconductor device and a method of polishing a substrate by use of the polishing slurry.

BACKGROUND ART

In a current production process of a ULSI semiconductor device, processing techniques for achieving a higher density and a higher degree of integration are under study and development. As one of such processing techniques, a CMP (Chemical Mechanical Polishing) technique has been gaining ground as a technique absolutely required for flattening of an interlayer insulating film, formation of shallow trench isolation, and formations of plugs and implanted metal wiring, in a production process of a semiconductor device.

In a conventional production process of a semiconductor device, silica ($SiO_2$)-based particles and ceria ($CeO_2$)-based particles have been widely used as abrasive of a CMP slurry for flattening an inorganic insulating film layer such as a silicon oxide insulating film which is formed by such a method as plasma CVD or low pressure CVD. A representative example of the silica-based abrasive is fumed silica. The fumed silica is produced by dispersing particles which has been grown by such a method as thermal decomposition of silicon tetrachloride, into a medium and then adjusting the pH of the solution. Polishing of an insulating film layer by use of a fumed silica abrasive has a problem that a polishing rate is low.

A representative example of the ceria-based abrasive is cerium oxide. The most outstanding feature of a cerium oxide abrasive is a high polishing rate which cannot be achieved by the silica-based abrasive. A ceria-based compound having a high valence such as cerium oxide, as known as a strong oxidizing agent, has a characteristic of being chemically active. Thus, its chemical action as an oxidizing agent and a mechanical removing action of particles interact with each other. It is believed that the cerium oxide abrasive thereby exhibits the high polishing rate.

The cerium oxide particles are lower in hardness than silica particles or alumina particles and therefore hardly make scratches on a surface to be polished. Hence, it is useful for giving a mirror finish to a surface to be polished. The cerium oxide abrasive is used for, for example, polishing a glass surface.

Taking advantage of these characteristics, the cerium oxide abrasive has been becoming widely used as a CMP abrasive for an insulating film of a semiconductor. This technique is disclosed in, for example, Japanese Patent Application Laid-Open No. 270402-1997. In recent years, along with an increase in the number of layers constituting a semiconductor device and an increase in the degree of integration of the semiconductor device, further increases in a yield and throughput of the semiconductor device have been increasingly demanded. Along with that, faster polishing which causes no scratches has been increasingly desired in a CMP process.

However, if the cerium oxide abrasive for polishing a glass surface is used for polishing an insulating film of a semiconductor as it is, particle diameters of its primary particles are so large that visibly observable scratches are made on the surface of the insulating film due to the large primary particle diameter when the surface is polished so vigorously as to attain a sufficiently high polishing rate. A decrease in the particle diameter of the primary particle can decrease the scratches but also lowers the polishing rate at the same time. In the case of cerium oxide, it is believed that the processing is caused to proceed by its chemical action and a mechanical removing action by particles, and the mechanical removing action by the particles causes scratches.

Thus, as a method for further decreasing scratches in a CMP process using the cerium oxide abrasive, an abrasive improving method such as a selection of the concentration or density or particle diameters of primary particles of the abrasive to cause a desired polishing rate and a surface condition without scratches, or a process improving method such as a reduction in a polishing pressure or a decrease in the rotation speed of a surface plate may be used. However, in any of these methods, there arises a problem that a polishing rate lowers, and it has been considered difficult to achieve a further increase in the polishing rate and a further decrease in the occurrence of the scratches at the same time. In the future, as the number of layers constituting a semiconductor device and the degree of integration of the semiconductor device are further increased, a polishing slurry which causes no scratches and can achieve fast polishing will be absolutely required to improve a yield of the semiconductor device.

Recently, not only to attain a high polishing rate but also to facilitate shallow trench isolation, a polishing slurry with a large ratio between a polishing rate for a silicon oxide insulating film and a polishing rate for a silicon nitride insulating film is demanded. Further, there has been a problem that the pH of a polishing slurry changes with time during polishing or storage and the change in the pH lowers a polishing rate.

In addition, there has been a case where abrasive dispersed in a polishing slurry exhibit instable dispersibility by settling or agglomeration. In evaluating such dispersion stability of the polishing slurry, the dispersion stability has been difficult to evaluate in numerics since particle diameters of the dispersed particles are small and a degree of settling cannot be recognized visually.

The present invention provides a polishing slurry whose abrasives, together with a surface to be polished such as a silicon oxide insulating film, form a chemical reaction layer and which is capable of polishing the layer while achieving an increase in polishing rate and a reduction in scratches at the same time, and a method of polishing a substrate by use of the polishing slurry.

Further, the present invention provides a polishing slurry which can achieve fast polishing with good reproducibility by suppression of a change in its pH with time, has a large ratio between a polishing rate for a silicon oxide film and a polishing rate for a silicon nitride film, has particles favorably dispersed therein so as to reduce occurrences of settling and agglomeration, and has dispersibility detectable and controllable by a variety of optics, and a method of polishing a substrate by use of the polishing slurry.

DISCLOSURE OF THE INVENTION

In view of the foregoing problems, the present inventors have paid attention to polishing which takes advantage of a chemical reaction of particles and is performed with a mechanical action thereof minimized so as to eliminate scratches caused by the particles in a polishing slurry and have made intensive studies, thereby completing the present invention.

A first invention of the present invention is directed to a polishing slurry comprising particles and a medium in which at least a part of the particles are dispersed, wherein the particles are made of at least one of a cerium compound selected from cerium oxide, cerium halide and cerium sulfide and having a density of 3 to 6 g/cm$^3$ and an average particle diameter of secondary particles of 1 to 300 nm, and a tetravalent metal hydroxide.

In particular, the particles preferably have a specific surface area of not smaller than 50 m$^2$/g and an average particle diameter of primary particles of not larger than 50 nm.

In the case where the particles are made of a tetravalent metal hydroxide, it is preferred that the particles have an average particle diameter of secondary particles of not larger than 300 nm, a density of 3 to 6 g/cm$^3$, and an average particle diameter of secondary particles of 1 to 300 nm, that the particles be at least one of a rare earth metal hydroxide and zirconium hydroxide, that the hydroxide of a rare earth metal be cerium hydroxide, and that the particles be a tetravalent metal hydroxide which is obtained by mixing a tetravalent metal salt with an alkali solution.

Further, it is also preferred that the polishing slurry have a pH of 3 to 9, its medium be water, and the polishing slurry contain a pH stabilizer, a dispersant and a polished surface treating agent.

The pH stabilizer preferably comprises one or more constituents, and at least one of the constituents preferably has a pKa value which falls within a 1.0 unit from the pH of the polishing slurry.

The dispersant is preferably selected from a water-soluble anionic dispersant, a water-soluble cationic dispersant, a water-soluble nonionic dispersant and a water-soluble amphoteric dispersant.

The polished surface treating agent is preferably a compound containing at least one atom having an unpaired electron in a molecular structure or a compound containing at least one of a nitrogen atom and an oxygen atom in a molecular structure.

Further, a ratio between a rate at which a silicon oxide insulating film is polished by the polishing slurry and a rate at which a silicon nitride insulating film is polished by the polishing slurry is preferably at least 5.

Still further, the polishing slurry preferably shows a light transmittance of not lower than 10% for light with a wavelength of 500 nm when the particles are contained in an amount of 0.2% by weight, and a difference between light transmittance at a wavelength of 500 to 700 nm of the polishing slurry immediately after its preparation and light transmittance at a wavelength of 500 to 700 nm of the polishing slurry after it is left to stand for 24 hours is preferably not higher than 20%.

Further, the polishing slurry preferably has a conductivity of not higher than 30 mS/cm, and the particles preferably have a positive zeta potential.

A second invention of the present invention relates to a method of polishing a substrate by use of the polishing slurry in the first invention.

In particular, it is preferred that the substrate be polished with a polishing pad having a Shore D hardness of not smaller than 50, the substrate be a substrate in a production process of a semiconductor device, and a silicon oxide film formed on the substrate be polished.

Further, it is preferred that the surface to be polished of the substrate in which at least the silicon oxide insulating film is formed and the polishing pad be moved relatively to each other while the polishing slurry is supplied to the polishing pad on a polishing surface plate so as to polish the substrate, and the silicon oxide insulating film is preferably polished with a polishing slurry containing particles of a tetravalent metal hydroxide such that a polishing rate would be 200 to 2,000 nm/min.

According to the foregoing polishing slurry and substrate polishing method according to the present invention, a surface to be polished such as a silicon oxide insulating film can be polished quickly without scratching the surface. Further, a polishing rate for a silicon oxide insulating film can be made sufficiently larger than a polishing rate for a silicon nitride insulating film so as to selectively polish the silicon oxide insulating film and facilitate control of a process such as shallow trench isolation. In addition, a polishing slurry whose particles show good dispersibility can be obtained, dispersion stability of the polishing slurry can be evaluated in numerics, and the end of polishing and concentrations and particle diameters of the particles in the polishing slurry can be detected and controlled by a variety of optical techniques.

BEST MODE FOR CARRYING OUT THE INVENTION

As particles contained in the polishing slurry of the present invention, (1) particles of a cerium compound selected from cerium oxide, cerium halide and cerium sulfide and having a density of 3 to 6 g/cm$^3$ and an average particle diameter of secondary particles of 1 to 300 nm or (2) particles of a tetravalent metal hydroxide are used. The particles (1) and the particles (2) may be used solely or in combination.

The cerium compound (1) in the present invention is at least one compound selected from cerium oxide, cerium halide and cerium sulfide, and cerium oxide is preferred in that a practical polishing rate can be attained.

Further, since the cerium compound is used for polishing a semiconductor, the content of alkali metals and halogen atoms in the cerium compound is preferably not higher than 10 ppm.

To prepare the tetravalent metal hydroxide (2) in the present invention, a method of mixing a tetravalent metal salt with an alkali solution can be used. This method is described in, for example, pages 304 and 305 of "Science of Rare Earth" (edited by Ginya Adachi, Kagaku-Dojin Publishing Co., Inc.). As the tetravalent metal salt, $M(SO_4)_2$, $M(NH_4)_2(NO_3)_6$, $M(NH_4)_4(SO_4)_4$ (wherein M represents a rare earth element) and $Zr(SO_4)_2 \cdot 4H_2O$ are preferred, for example. A chemically active Ce salt is particularly preferred. As the alkali solution, ammonia water, potassium hydroxide and sodium hydroxide can be used, and ammonia water is preferably used. Tetravalent metal hydroxide particles synthesized by the above method can be washed so as to remove metal impurities. To wash the metal hydroxide, a method of repeating solid-liquid separation by centrifugation several times can be used, for example.

As the tetravalent metal hydroxide, at least one of a rare earth metal hydroxide and zirconium hydroxide is preferably used. As the rare earth metal hydroxide, cerium hydroxide is more preferred.

When the thus washed tetravalent metal hydroxide particles or the cerium compound particles are at least partially, preferably wholly, dispersed in a liquid medium, slurry can be prepared.

As means for dispersing the particles of the metal hydroxide or cerium compound in the medium, a homogenizer, an ultrasonic dispersion equipment and a ball mill can be used in addition to dispersion treatment by a conventional agitator.

Although the slurry comprising the particles and the medium in which at least a part of the particles are dispersed may be used as it is as the polishing slurry of the present invention, it can be used as the polishing slurry after a dispersant, a polished surface treating agent, a pH stabilizer, an inhibitor and the like are added as required. These can be added before or after the particles are dispersed in the medium.

An average specific surface area of primary particles (hereinafter referred to as "specific surface area of particles") of the particles in the polishing slurry is preferably not smaller than 50 m$^2$/g. Further, it is preferably not larger than 500 m$^2$/g, more preferably 80 to 500 m$^2$/g, much more preferably 100 to 350 m$^2$/g, particularly preferably 150 to 200 m$^2$/g. The specific surface area can be measured by a BET method based on nitrogen adsorption (for instance, trade name: AUTOSORB, products of QUANTACHROME CO., LTD.). In this case, a sample to be measured is subjected to pretreatment at 150° C.

Further, an average of particle diameters of secondary particles (hereinafter referred to as "average particle diameter of secondary particles") of the above particles dispersed in the polishing slurry is preferably not larger than 300 nm. It is more preferably 2 to 200 nm, much more preferably 10 to 200 nm, most preferably 50 to 150 nm. In particular, in the case of the cerium compound particles (1), an average particle diameter of secondary particles must be 1 to 300 nm. When it is smaller than 1 nm, a polishing rate is apt to be low.

The particles in the polishing slurry need to cause a chemical action with a film to be polished. Hence, when the specific surface area is smaller than 50 m$^2$/g, areas of the particles in which they make contact with the film to be polished become small, thereby decreasing a polishing rate. Meanwhile, when the average particle diameter of the secondary particles is larger than 300 nm, the areas of the particles in which they make contact with the film to be polished also become small, thereby decreasing the polishing rate.

In the present invention, "primary particles" refer to the smallest particles which correspond to crystallites surrounded by gain boundaries recognizable when observed in a powdery state by, for example, a transmission electron microscope (TEM). Further, "secondary particles" refer to agglomerations of the primary particles. In the present invention, the particle diameter of the secondary particle is measured by a photon correlation spectroscopy. For example, it can be measured by means of ZETA SIZER 3000HS manufactured by Malvern Instruments, Ltd. or COULTER N4SD manufactured by COULTER CO., LTD.

An average particle diameter of the primary particles of the particles is preferably not larger than 50 nm, more preferably 0.1 to 50 nm, much more preferably 1 to 30 nm, particularly preferably 3 to 10 nm.

In the present invention, when a photograph of the particles is taken by a transmission electron microscope (TEM) and a primary particle (crystallite) is sandwiched between two parallel lines, a value of the shortest distance between the lines is taken as a short diameter, a value of the longest distance between the lines as a long diameter, and an average of the shortest distance and the longest distance as the size of the crystallite. As the average particle diameter of the primary particles, an average of sizes of 100 crystallites is taken. When the average particle diameter of the primary particles is larger than 50 nm, a rate of occurrence of fine scratches is apt to be high, while when it is smaller than 0.1 nm, the polishing rate is liable to lower.

The particles preferably have a density of 3 to 6 g/cm$^3$, more preferably 4 to 5 g/cm$^3$. In particular, the cerium compound particles (1) must have a density of 3 to 6 g/cm$^3$.

When the density is lower than 3 g/m$^3$, the effect of the particles on the surface to be polished is weakened, and the polishing rate is liable to lower. Meanwhile, when the density is higher than 6 g/m$^3$, it becomes difficult to suppress occurrences of scratches. The density of the particles is measured by, for example, a gas replacement method (for example, trade name: ULTRAPYCNOMETER 1000, measuring device of QUANTACHROME CO., LTD.).

The pH of the polishing slurry is preferably 3 to 9, more preferably 5 to 8, particularly preferably 5.5 to 7. When the pH is smaller than 3, the efficacy of the chemical action becomes low, thereby causing a decrease in the polishing rate. Meanwhile, when the pH is larger than 9, the particle diameters of the secondary particles become large, thereby causing a decrease in the polishing rate.

As a medium in which the particles are to be dispersed, a medium selected from the following group is suitable in addition to water. Illustrative examples of such a medium include alcohols such as methanol, ethanol, 1-propanol, 2-propanol, 2-propyne-1-ol, allyl alcohol, ethylenecyanohydrin, 1-butanol, 2-butanol(S)-(+)-2-butanol, 2-methyl-1-propanol, t-butanol, perfluoro-t-butanol, t-pentyl alcohol, 1,2-ethanediol, 1,2-propanediol, 1,3-propanediol, 1,3-butanediol, 2,3-butanediol, 1,5-pentanediol, 2-butene-1,4-diol, 2-methyl-2,4-pentanediol, glycerine, 2-ethyl-2-(hydroxymethyl)-1,3-propanediol, and 1,2,6-hexanetriol; ethers such as dioxane, trioxane, tetrahydrofuran, diethylene glycol diethyl ether, 2-methoxyethanol, 2-ethoxyethanol, 2,2-(dimethoxy) ethanol, 2-isopropoxyethanol, 2-butoxyethanol, 1-methoxy-2-propanol, 1-ethoxy-2-propanol, furfuryl alcohol, tetrahydrofurfuryl alcohol, ethylene glycol, diethylene glycol, diethylene glycol monomethyl ether, diethylene glycol monoethyl ether, diethylene glycol monobutyl ether, triethylene glycol, triethylene glycol monomethyl ether, tetraethylene glycol, dipropylene glycol, dipropylene glycol monomethyl ether, dipropylene glycol monoethyl ether, tripropylene glycol monomethyl ether, polyethylene glycol, diacetone alcohol, 2-methoxyethyl acetate, 2-ethoxyethyl acetate, and diethylene glycol monoethyl ether acetate; and ketones such as acetone, methyl ethyl ketone, acetylacetone, and cyclohexanone.

Of these, water, methanol, ethanol, 2-propanol, tetrahydrofuran, ethylene glycol, acetone, and methyl ethyl ketone are more preferable, and water is particularly preferable in that a high polishing rate can be attained.

Further, the amount of the medium is preferably 1,000 to 1,000,000 parts by weight, more preferably 10,000 to 100,000 parts by weight, based on 100 parts by weight of the particles.

A pH stabilizer to be contained in the polishing slurry of the present invention can be selected as appropriate from those which are conventionally used as a pH buffer, such as a mixture of a carboxylic acid and its salt, a mixture of phosphoric acid and its salt, a mixture of boric acid and its salt, and a mixture of an amine and its salt.

A preferably used pH stabilizer is one which comprises one or more constituents, wherein at least one of the constituents has a pKa value which falls within a 1.0 unit from the pH of the polishing slurry. For example, to adjust the pH of the polishing slurry from 5.0 to 6.0, a mixture of phosphoric acid and its salt, a mixture of acetic acid and its salt, a mixture of propionic acid and its salt, a mixture of malonic acid and its salt, a mixture of succinic acid and its salt, a mixture of glutaric acid and its salt, a mixture of adipic acid and its salt, a mixture of maleic acid and its salt, a mixture of fumaric acid and its salt, a mixture of phthalic acid and its salt, a mixture of citric acid and its salt, a mixture of ethylenediamine and its salt, a mixture of pyridine and its salt, a mixture of 2-aminopyridine and its salt, a mixture of 3-aminopyridine and its salt, a mixture of xanthosine and its salt, a mixture of toluidine and its salt, a mixture of picolinic acid and its salt, a mixture of histidine and its salt, a mixture of piperazine and its salt, a mixture of N-methylpiperazine and its salt, a mixture of 2-bis(2-hydroxyethyl)amino-2-(hydroxymethyl)-1,3-propanediol and its salt, and a mixture of uric acid and its salt are suitably used.

When the pKa value does not fall within a 1.0 unit from the pH of the polishing slurry, the pH is apt to increase over a long time period, thereby decreasing the polishing rate. The pKa value is more preferably within 0.5 units, much more preferably within 0.2 units, from the pH of the polishing slurry.

The polishing slurry of the present invention preferably contains a dispersant. The dispersant may be any compound which acts on the particles in the polishing slurry so as to reduce settling and maintain dispersibility. Inclusion of the dispersant in the polishing slurry makes it possible to control the polishing rate or flatness of a surface to be polished and inhibit occurrences of scratches. The dispersant is preferably selected from a water-soluble anionic dispersant, a water-soluble nonionic dispersant, a water-soluble cationic dispersant and a water-soluble amphoteric dispersant. They may be used alone or in combination of two or more.

Illustrative examples of the water-soluble anionic dispersant include triethanolamine lauryl sulfate, ammonium lauryl sulfate, and triethanolamine polyoxyethylene alkyl ether sulfate. Further, an anionic water-soluble polymer to be described later may also be used.

Illustrative examples of the water-soluble nonionic dispersant include polyoxyethylene lauryl ether, polyoxyethylene cetyl ether, polyoxyethylene stearyl ether, polyoxyethylene oleyl ether, polyoxyethylene higher alcohol ether, polyoxyethylene octyl phenyl ether, polyoxyethylene nonyl phenyl ether, polyoxyalkylene alkyl ether, a polyoxyethylene derivative, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hydrogenated castor oil, and alkylalkanolamide. Of these, the polyoxyethylene alkylamine such as polyoxyethylene octylamine is preferred.

Illustrative examples of the water-soluble cationic dispersant include coconut amine acetate and stearyl amine acetate.

Illustrative examples of the water-soluble amphoteric dispersant include lauryl betaine, stearyl betaine, lauryldimethylamine oxide, 2-alkyl-N-carboxymethyl-N-hydroxyethyl imidazolinium betaine.

At least one of the dispersants is selected and added. The dispersants are added in an amount of preferably 0.01 to 1,000 parts by weight based on 100 parts by weight of the particles in view of dispersibility, prevention of settling, and a relationship with scratches. The amount is more preferably 0.1 to 100 parts by weight, much more preferably 1 to 100 parts by weight.

The molecular weight of the dispersant is preferably 100 to 5,000,000, more preferably 1,000 to 500,000, much more preferably 10,000 to 100,000.

When the molecular weight of the dispersant is lower than 100, a satisfactory polishing rate may not be obtained at the time of polishing a silicon oxide film or silicon nitride film. On the other hand, when the molecular weight of the dispersant is higher than 5,000,000, the viscosity becomes high, so that storage stability of the polishing slurry may be degraded.

The polishing slurry of the present invention preferably contains a polished surface treating agent. The polished surface treating agent may be any compound having an atom or structure capable of forming a hydrogen bond with a hydroxyl group existing on a surface to be polished. The polished surface treating agent is preferably a compound containing at least one atom having an unpaired electron in a molecular structure or a compound containing at least one of a nitrogen atom and an oxygen atom in a molecular structure. Thereby, for example, a ratio between a polishing rate for a silicon oxide insulating film and a polishing rate for a silicon nitride insulating film can be made larger, which is suitable for shallow trench isolation.

Specific examples thereof include polymeric compounds such as polyvinyl acetal, polyvinyl formal, polyvinyl butyral, polyvinyl pyrolidone, a polyvinyl pyrolidone-iodine complex, polyvinyl(5-methyl-2-pyrrolidinone), polyvinyl (2-piperidinone), polyvinyl(3,3,5-trimethyl-2-pyrrolidinone), poly(N-vinylcarbazole), poly(N-alkyl-2-vinylcarbazole), poly(N-alkyl-3-vinylcarbazole), poly(N-alkyl-4-vinylcarbazole), poly(N-vinyl-3,6-dibromocarbazole), polyvinyl phenyl ketone, polyvinyl acetophenone, poly(4-vinylpyridine), poly(4-β-hydroxyethylpyridine), poly(2-vinylpyridine), poly(2-β-vinylpyridine), poly(4-vinylpyridine), poly(4-vinylpyridine), poly(4-hydroxyethylpyridine), poly(4-vinylpyridinium salt), poly(α-methylstyrene-co-4-vinylpyridinium hydrochloride), poly(1-(3-sulfonyl)-2-vinylpyridiniumbetaine co-p-potassium styrenesulfonate), poly(N-vinylimidazole), poly(N-vinylimidazole), poly(N-vinylimidazole), poly(N-vinylimidazole), poly(N-vinylimidazole), poly(N-vinylimidazole), poly(4-vinylimidazole), poly(5-vinylimidazole), poly(1-vinyl-4-methyloxazolidinone), polyvinyl acetamide, polyvinyl methyl acetamide, polyvinyl ethyl acetamide, polyvinyl phenyl acetamide, polyvinyl methyl propionamide, polyvinyl ethyl propionamide, polyvinyl methyl isobutylamide, polyvinyl methyl benzylamide, poly(meth)acrylic acid, a poly(meth)acrylic acid derivative, a poly(meth)acrylic acid ammonium salt, polyvinyl alcohol, a polyvinyl alcohol derivative, polyacrolein, polyacrylonitrile, polyvinyl acetate, poly(vinyl acetate-co-methyl methacrylate), poly(vinyl acetate-co-vinyl acrylate), poly(vinyl acetate-co-pyrrolidine), poly(vinyl acetate-co-acetonitrile), poly(vinyl acetate-co-N,N-diallylcyanide), poly(vinyl acetate-co-N,N-diallylamine), and poly(vinyl acetate-co-ethylene).

Further, as the polished surface treating agent, anionic compounds (hereinafter referred to as "anionic additives") including water-soluble organic compounds having at least one of free —COOM, phenolic —OH, —$SO_3M$, —$O \cdot SO_3H$, —$PO_4M_2$ and —$PO_3M_2$ groups (wherein M is H, $NH_4$ or an alkali metal atom) can also be used.

Illustrative examples of such anionic additives include the following, i.e., carboxylic acids such as formic acid, acetic acid, propionic acid, butyric acid, valeric acid, caproic acid, enanthic acid, caprylic acid, pelargonic acid, capric acid, undecanoic acid, lauric acid, tridecanoic acid, myristic acid, pentadecanoic acid, palmitic acid, heptadecanoic acid, stearic acid, oleic acid, linoleic acid, linolenic acid, cyclohexanecarboxylic acid, phenylacetic acid, benzoic acid, o-toluic acid, m-toluic acid, p-toluic acid, o-methoxybenzoic acid, m-methoxybenzoic acid, pmethoxybenzoic acid, acrylic acid, methacrylic acid, crotonic acid, pentenoic acid, hexenoic acid, heptenoic acid, octenoic acid, nonenic acid, decenoic acid, undecenoic acid, dodecenoic acid, tridecenoic acid, tetradecenoic acid, pentadecenoic acid, hexadecenoic acid, heptadecenoic acid, isobutyric acid, isovaleric acid, cinnamic acid, quinaldic acid, nicotinic acid, 1-naphthoic acid, 2-naphthoic acid, picolinic acid, vinylacetic acid, phenylacetic acid, phenoxyacetic acid, 2-furancarboxylic acid, mercaptoacetic acid, levulinic acid, oxalic acid, malonic acid, succinic acid, glutaric acid, adipic acid, pimelic acid, suberic acid, azelaic acid, sebacic acid, 1,9-nonanedicarboxylic acid, 1,10-decanedicarboxylic acid, 1,11-undecanedicarboxylic acid, 1,12-dodecanedicarboxylic acid, 1,13-tridecanedicarboxylic acid, 1,14-tetradecanedicarboxylic acid, 1,15-pentadecanedicarboxylic acid, 1,16-hexadecanedicarboxylic acid, maleic acid, fumaric acid, itaconic acid, citraconic acid, mesaconic acid, quinolinic acid, quininic acid, naphthalic acid, phthalic acid, isophthalic acid, terephthalic acid, glycolic acid, lactic acid, 3-hydroxypropionic acid, 2-hydroxybutyric acid, 3-hydroxybutyric acid, 4-hydroxybutyric acid, 3-hydroxyvaleric acid, 5-hydroxyvaleric acid, quinic acid, kynurenic acid, salicylic acid, tartaric acid, aconitic acid, ascorbic acid, acetylsalicylic acid, acetylmalic acid, acetylenedicarboxylic acid, acetoxysuccinic acid, acetoacetic acid, 3-oxoglutaric acid, atropic acid, atrolactinic acid, anthraquinonecarboxylic acid, anthracenecarboxylic acid, isocaproic acid, isocamphoronic acid, isocrotonic acid, 2-ethyl-2-hydroxybutyric acid, ethylmalonic acid, ethoxyacetic acid, oxaloacetic acid, oxydiacetic acid, 2-oxobutyric acid, camphoronic acid, citric acid, glyoxylic acid, glycidic acid, glyceric acid, glucaric acid, gluconic acid, croconic acid, cyclobutanecarboxylic acid, cyclohexanedicarboxylic acid, diphenylacetic acid, di-O-benzoyltartaric acid, dimethylsuccinic acid, dimethoxyphthalic acid, tartronic acid, tannic acid, thiophenecarboxylic acid, tiglic acid, desoxalic acid, tetrahydroxysuccinic acid, tetramethylsuccinic acid, tetronic acid, dehydroacetic acid, terebic acid, tropic acid, vanillic acid, paraconic acid, hydroxyisophthalic acid, hydroxycinnamic acid, hydroxynaphthoic acid, o-hydroxyphenylacetic acid, m-hydroxyphenylacetic acid, p-hydroxyphenylacetic acid, 3-hydroxy-3-phenylpropionic acid, pivalic acid, pyridinedicarboxylic acid, pyridinetricarboxylic acid, pyruvic acid, α-phenylcinnamic acid, phenylglycidic acid, phenylsuccinic acid, phenylacetic acid, phenyllactic acid, propiolic acid, sorbic acid, 2,4-hexadienediacid, 2-benzylidenepropionic acid, 3-benzylidenepropionic acid, benzylidenemalonic acid, benzilic acid, benzenetricarboxylic acid, 1,2-benzenediacetic acid, benzoyloxyacetic acid, benzoyloxypropionic acid, benzoylformic acid, benzoylacetic acid, O-benzoyllactic acid, 3-benzoylpropionic acid, gallic acid, mesoxalic acid, 5-methylisophthalic acid, 2-methylcrotonic acid, α-methylcinnamic acid, methylsuccinic acid, methylmalonic acid, 2-methylbutyric acid, o-methoxycinnamic acid, p-methoxycinnamic acid, mercaptosuccinic acid, mercaptoacetic acid, O-lactoyllactic acid, malic acid, leukonic acid, leucinic acid, rhodizonic acid, rosolic acid, α-ketoglutaric acid, L-ascorbic acid, iduronic acid, galacturonic acid, glucuronic acid, pyroglutamic acid, ethylenediamine tetraacetic acid, cyanide triacetic acid, aspartic acid, and glutamic acid; phenols such as phenol, o-cresol, m-cresol, p-cresol, o-chlorophenol, m-chlorophenol, p-chlorophenol, o-aminophenol, m-aminophenol, p-aminophenol, o-nitrophenol, m-nitrophenol, p-nitrophenol, 2,4-dinitrophenol, 2,4,6-trinitrophenol, catechol, resorcinol, and hydroquinone; and sulfonic acids such as methanesulfonic acid, ethanesulfonic acid, propanesulfonic acid, butanesulfonic acid, pentanesulfonic acid, hexanesulfonic acid, heptanesulfonic acid, octanesulfonic acid, nonanesulfonic acid, decanesulfonic acid, undecanesulfonic acid, dodecanesulfonic acid, tridecanesulfonic acid, tetradecanesulfonic acid, pentadecanesulfonic acid, hexadecanesulfonic acid, heptadecanesulfonic acid, octadecanesulfonic acid, benzenesulfonic acid, naphthalenesulfonic acid, toluenesulfonic acid, hydroxyethanesulfonic acid, hydroxyphenolsulfonic acid, and anthracenesulfonic acid. Further, the anionic additives may also be derivatives of the above carboxylic acids and sulfonic acids obtained by substituting at least one of protons in the main chain of the carboxylic acid or sulfonic acid with an atom or group of atoms such as F, Cl, Br, I, OH, CN and $NO_2$.

In addition, N-acylamino acid such as N-acyl-N-methylglycine, N-acyl-N-methyl-β-alanine or N-acylglutamic acid, polyoxyethylene alkyl ether carboxylic acid, acyl peptide, alkylbenzenesulfonic acid, linear alkylbenzenesulfonic acid, alkylnaphthalenesulfonic acid, naphthalenesulfonic acid formaldehyde polycondensation, melaminesulfonic acid formaldehyde polycondensation, dialkyl sulfosuccinate, alkyl sulfosuccinate, polyoxyethylene alkyl sulfosuccinate, alkyl sulfoacetic acid, α-olefinsulfonic acid, N-acyl methyl taurine, dimethyl-5-sulfoisophthalate, sulfonated oil, higher alcohol sulfate, secondary higher alcohol sulfate, polyoxyethylene alkyl ether sulfuric acid, secondary alcohol ethoxy sulfate, polyoxyethylene alkyl phenyl ether sulfuric acid, monoglysulfate, fatty acid alkylol amide sulfate, polyoxyethylene alkyl ether phosphoric acid, polyoxyethylene alkyl phenyl ether phosphoric acid, and alkyl phosphoric acid can also be preferably used.

Further, the anionic additives may be water-soluble polymers such as a polymaleic acid, polyaspartic acid, carboxymethyl cellulose and alginic acid or derivatives thereof.

These anionic additives may be used as they are or may be used also in the form of salts of alkali metals such as Na and K or salts of ammonia and the like.

Of the above polished surface treating agents, polyvinyl alcohol and derivatives thereof and a polyvinyl-alcohol-based copolymer and derivatives thereof are preferably selected. Particularly, polyvinyl alcohol and the derivatives thereof are preferably used. Further, a polyvinyl-alcoholbased copolymer containing (A) vinyl alcohol and (B) any one of vinyl acetate, vinyl formal, vinyl acetal, vinyl amine, vinyl isobutyl ether and vinyl pyrrolidone as constituents is also preferably used. Polyvinyl alcohol and polyvinyl pyrrolidone are more preferred.

At least one of the polished surface treating agents is selected and used. These polished surface treating agents may be added in any amount without particular limitations. However, in view of a relationship between dispersibility of the particles in the polishing slurry and prevention of settling of the particles, the amount is preferably 0.01 to 1,000 parts by weight, more preferably 1 to 300 parts by weight, much more preferably 10 to 100 parts by weight, based on 100 parts by weight of the particles.

Further, when the polished surface treating agents are polymeric compounds, an average molecular weight thereof is preferably 100 to 5,000,000, more preferably 1,000 to 500,000, much more preferably 10,000 to 100,000. When the molecular weight of the polished surface treating agent is lower than 100, a satisfactory polishing rate may not be attained at the time of polishing the silicon oxide film or silicon nitride film, while when the molecular weight of the polished surface treating agent is higher than 5,000,000, the viscosity becomes high, and storage stability of the polishing slurry may be degraded.

In addition, the polishing slurry of the present invention preferably satisfies at least one of the following two conditions with respect to light transmittance at a wavelength of 500 to 700 nm and a change in the light transmittance with time.

A first condition is that the polishing slurry exhibits a light transmittance at a wavelength of 500 nm of not lower than 10% when 0.2% by weight of the above particles are contained in the polishing slurry. The light transmittance is more preferably not lower than 20%, much more preferably not lower than 30%.

A second condition is that a difference between light transmittance at a wavelength of 500 to 700 nm of the polishing slurry immediately after its preparation and light transmittance at a wavelength of 500 to 700 nm of the polishing slurry after it is left to stand for 24 hours is not higher than 20%. The difference is more preferably not higher than 10%, much more preferably not higher than 5%. When the difference is higher than 20%, dispersion stability may be degraded. For example, when light transmittance at a wavelength of 500 nm of a polishing slurry is 22.3% right after its preparation and 24.7% after left to stand for 24 hours, the difference is 2.4%.

The light transmittance of the polishing slurry is measured by use of light having a wavelength of 500 to 700 nm and can be measured by means of, for example, a spectrophotometer U-3410 manufactured by HITACHI, LTD. If the light transmittance is 10% or higher when the particles are contained in the polishing slurry in an amount of more than 0.2% by weight, the light transmittance is 10% or higher even if the amount of the particles is 0.2% by weight. To obtain a polishing slurry which satisfies the above light transmittance range, for example, a dispersant may be added to the polishing slurry or the polishing slurry may be subjected to ultrasonic dispersion preferably twice or more or filtered through an about 1-$\mu$m membrane.

In the case of a polishing slurry having the light transmittance of lower than 10% or a polishing slurry with the higher difference in light transmittance as described above, particles thereof are liable to settle, and handlings thereof are liable to be complicated. Further, wavelength of occurrences of scratches increases. In addition, when the light transmittance is low, detection and control (for instance, detection and control of end of polishing, detection of concentration of particles in the polishing slurry, and the like) by various optics are not satisfactory.

Although the concentration of the particles in the polishing slurry is not particularly limited, it is preferably 0.01 to 5% by weight in view of ease of handling of the polishing slurry.

The polishing slurry preferably has a conductivity of not higher than 30 mS/cm. It is generally difficult to make the conductivity zero. The conductivity is more preferably 0.01 to 10 mS/cm, much more preferably 0.01 to 3 mS/cm. The conductivity can be measured by use of, for example, a CM-20 measuring device manufactured by Toa Denshi Kogyo Co., Ltd. When the conductivity exceeds 30 mS/cm, the particles in the polishing slurry are liable to agglomerate, and an amount of settled particles increases.

To obtain a polishing slurry with a conductivity of not higher than 30 mS/cm, for example, in a step of mixing a tetravalent metal salt with an alkali solution so as to produce metal hydroxide particles, the concentration of the tetravalent metal salt in the mixture and the pH of the mixture should not be too high.

The particles dispersed in the polishing slurry preferably have a positive zeta potential. Although the zeta potential is not particularly limited, a zeta potential of not higher than about 80 mV is sufficient for ordinary polishing. Further, the zeta potential is more preferably not lower than 10 mV, much more preferably not lower than 20 mV. The zeta potential can be measured by means of, for example, a laser Doppler method (for example, ZETA SIZER 3000HS, product of Malvern Instruments, Ltd.). When the zeta potential is 0 mV or lower, the polishing rate lowers. It is assumed that this is because the chemical action of the particles in the polishing slurry decreases. Further, when an absolute value of the zeta potential is large, the particles are not agglomerated and settled easily, resulting in good dispersibility. To make the zeta potential positive, for example, the pH of the polishing slurry is made equal to or lower than the isoelectric point of the particles.

The polishing method of the present invention comprises polishing a substrate by use of the polishing slurry of the present invention. As the substrate, a substrate in a production process of a semiconductor device is preferably used. Further, it is preferable to polish a silicon oxide film formed on the substrate.

As the substrate, there can be used a semiconductor substrate having a silicon oxide film and/or a silicon nitride film formed thereon, such as a semiconductor substrate having a circuit element and a wiring pattern formed thereon or a semiconductor substrate having a circuit element formed thereon.

When the silicon oxide film layer or silicon nitride film layer formed on such a substrate is polished with the above polishing slurry being supplied onto the layer, unevenness on the surface of the silicon oxide film layer can be smoothed, resulting in a smooth surface which is free from scratches across the substrate.

Hereinafter, the method of the present invention for polishing a substrate when the substrate is a semiconductor substrate having a silicon oxide film formed thereon will be described. However, the polishing method of the present invention is not limited to the particular type of substrate.

As a polishing device, there can be used a commonly used polishing device which comprises a holder for holding the semiconductor substrate and a polishing surface plate having a polishing pad (or polishing cloth) attached thereon and equipped with a motor whose speed of rotation can be changed.

Figure 1:
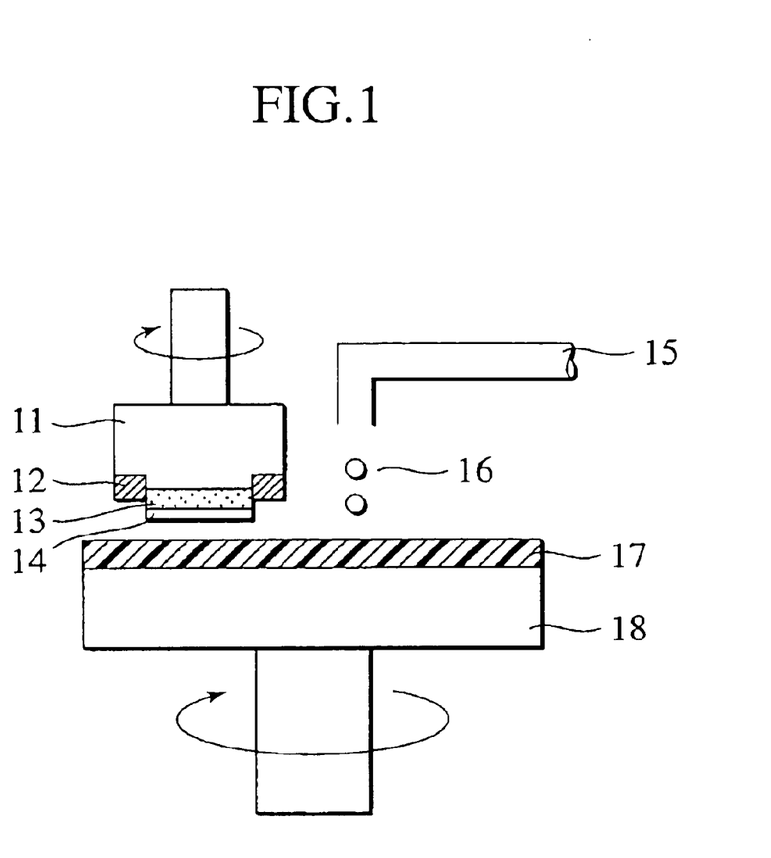
FIG. 1 is a schematic diagram showing one embodiment of the present invention which uses a CMP device.

FIG. 1 is a schematic diagram showing one embodiment of the present invention which uses a CMP device. The device of FIG. 1 has the following constitution. That is, a polishing slurry 16 of the present invention which contains particles and a medium is supplied from a polishing slurry supply mechanism 15 onto a polishing pad 17 attached on a polishing surface plate 18. Meanwhile, a semiconductor substrate 13 which has a silicon oxide insulating film 14 thereon is attached to a wafer holder 11 and secured by means of a retainer 12. The silicon oxide insulating film 14 which is a surface to be polished is brought into contact with the polishing pad 17, and the surface to be polished and the polishing pad are moved relatively to each other, more specifically, the wafer holder 11 and the polishing surface plate 18 are rotated, thereby carrying out CPM polishing.

The polishing pad 17 on the polishing surface plate 18 may be a general nonwoven fabric, polyurethane foam, porous fluorine resin or the like and is not particularly limited. Further, it is preferable that grooves in which the polishing slurry 16 accumulates be formed on the polishing pad. Conditions for polishing are not particularly limited. The rotation speed of the polishing surface plate is preferably 100 rpm or slower so as to prevent the semiconductor substrate 13 from moving off the surface plate. A pressing pressure (processing load) of the semiconductor substrate 13 having the silicon oxide insulating film 14 which is the surface to be polished against the polishing pad 17 is preferably 10 to 100 kPa (102 to 1,020 gf/cm$^2$) and more preferably 20 to 50 kPa (204 to 510 gf/cm$^2$) in order to attain a uniform polishing rate across the surface to be polished and flatness of a pattern. During polishing, the polishing slurry 16 of the present invention is continuously supplied onto the polishing pad 17 by means of the polishing slurry supply mechanism 15 such as a pump. Although the supply mechanism and the amount of the supplied polishing slurry 16 are not particularly limited, it is preferred that the surface of the polishing pad be always covered with the polishing slurry.

The polishing pad for polishing the substrate preferably has a Shore D hardness of not smaller than 50, more preferably 55 to 99, much more preferably 60 to 95. When the pad has a Shore D hardness of smaller than 50, the mechanical action of the pad tends to decrease, thereby lowering the polishing rate. The Shore D hardness never becomes a value of 100 or larger by definition, and when the polishing pad is too hard, scratches may be formed on the surface to be polished. The Shore D hardness of the pad can be measured by a Shore D hardness meter (such as "ASKER" rubber hardness meter type D, product of KOBUNSHI KEIKI CO., LTD.).

A polishing pad having a Shore D hardness of not smaller than 50 may be a foam or a non-foam such as fabric or a nonwoven fabric. As a material of the polishing pad, resins such as polyurethane, acryl, polyester, acryl-ester copolymer, polytetrafluoroethylene, polypropylene, polyethylene, poly4-methylpentene, cellulose, cellulose ester, polyamides such as nylon and aramid, polyimide, polyimideamide, polysiloxane copolymer, oxirane compound, phenol resin, polystyrene, polycarbonate and epoxy resin can be used.

Further, fine projections are preferably formed on the surface of the polishing pad. In addition, grooves may be formed on the surface of the polishing pad by a variety of means.

When fine projections are formed on the surface of the polishing pad, an area of the top surface of the projection is preferably not larger than 0.25 mm$^2$, more preferably 100 mm$^2$ to 0.25 mm$^2$. When the area is larger than 0.25 mm$^2$, the polishing rate tends to decrease, while when it is smaller than 100 $\mu$m$^2$, formation of the fine projections is difficult.

It is desirable that variations of heights of the fine projections be low. The variations of the heights (1$\sigma$/average height) are preferably not higher than 10%. When the variations of the heights (1$\sigma$/average height) are higher than 10%, some of the fine projections do not make contact with the surface to be polished on the substrate at the time of polishing, resulting in insufficient stability of polishing properties.

An average height of the fine projections is preferably 1 to 200 $\mu$m. When the average height is larger than 200 $\mu$m, the polishing slurry flows excessively, thereby causing a decrease in the polishing rate. Meanwhile, when it is smaller than 1 $\mu$m, top surfaces of the fine projections are liable to be adsorbed to the surface to be polished, thereby inhibiting smooth polishing. Shapes of the fine projections may be pyramidal, conical, prismatic, cylindrical, semispherical, and the like and are not particularly limited. Further, an average pitch of the fine projections is preferably 30 to 1,000 $\mu$m. When the average pitch is smaller than 30 $\mu$m, space between the projections is so small that the space is clogged by scratch chippings or the like. Meanwhile, when it is larger than 1,000 $\mu$m fine projections which make contact with the surface to be polished are so few that the polishing rate lowers.

As a method of preparing a pad having such fine projections, an embossing roll method, a metal molding method or a transfer method can be used. Of these, the transfer method in which a pattern is transferred from a mold having fine pits and projections onto a photo-curing resin is preferred. A photo-curing resin composition used in the photo-curing resin layer is not particularly limited.

When a polishing pad is used in the shape of a belt, a pad in the shape of a web is preferred. An example of the polishing pad in this shape is a polishing pad having, on a substrate layer of a biaxially stretched polyethylene terephthalate, a photo-curing resin layer on which fine projections have been transferred from a mold and formed by photo-curing.

Further, a polishing method comprising polishing with a polishing pad having a Shore D hardness of not smaller than 50 may be applied not only to polishing of a silicon oxide film and the like but also to polishing of a metal film such as copper or aluminum formed on a semiconductor substrate.

In the polishing method of the present invention, it is preferable that the surface to be polished of the semiconductor substrate in which at least the silicon oxide insulating film, e.g., a silicon oxide film, a silicon oxide film and a silicon nitride film, is formed and the polishing pad on a polishing surface plate be moved relatively to each other with the polishing slurry being supplied onto the polishing pad so as to polish the substrate. To cause the relative motion, in addition to rotating the polishing surface plate, the holder may be rotated or rocked so as to perform polishing. Further, a polishing method in which the polishing surface plate is rotated in a sun-and-planet motion, a polishing method in which a polishing pad in the shape of a belt is moved straight in a longitudinal direction or other polishing methods may also be used. The holder may be secured, rotated or rocked. These polishing methods can be selected as appropriate according to a surface to be polished and a polishing device as long as a polishing pad and a substrate are moved relatively to each other.

It is preferable that the silicon oxide insulating film be polished by such a polishing method such that a polishing rate would be 200 to 2,000 nm/min. Particularly, it is preferable to perform polishing with a polishing slurry containing particles of a tetravalent metal hydroxide so as to achieve the above polishing rate.

Further, to perform polishing with the surface of the polishing pad always in the same condition, it is preferable to insert a step of conditioning the polishing pad before polishing of the substrate by CMP. Preferably, for example, polishing is performed with a solution comprising at least water by use of a dresser having diamond particles thereon. Then, the polishing process according to the present invention is carried out, and then a substrate washing step comprising:

1) brush washing for removing foreign matter such as particles adhered to the polished substrate,
2) megasonic washing for replacing the polishing slurry and the like with water, and
3) spin drying for removing the water from the surface of the substrate is carried out.

Figure 2:
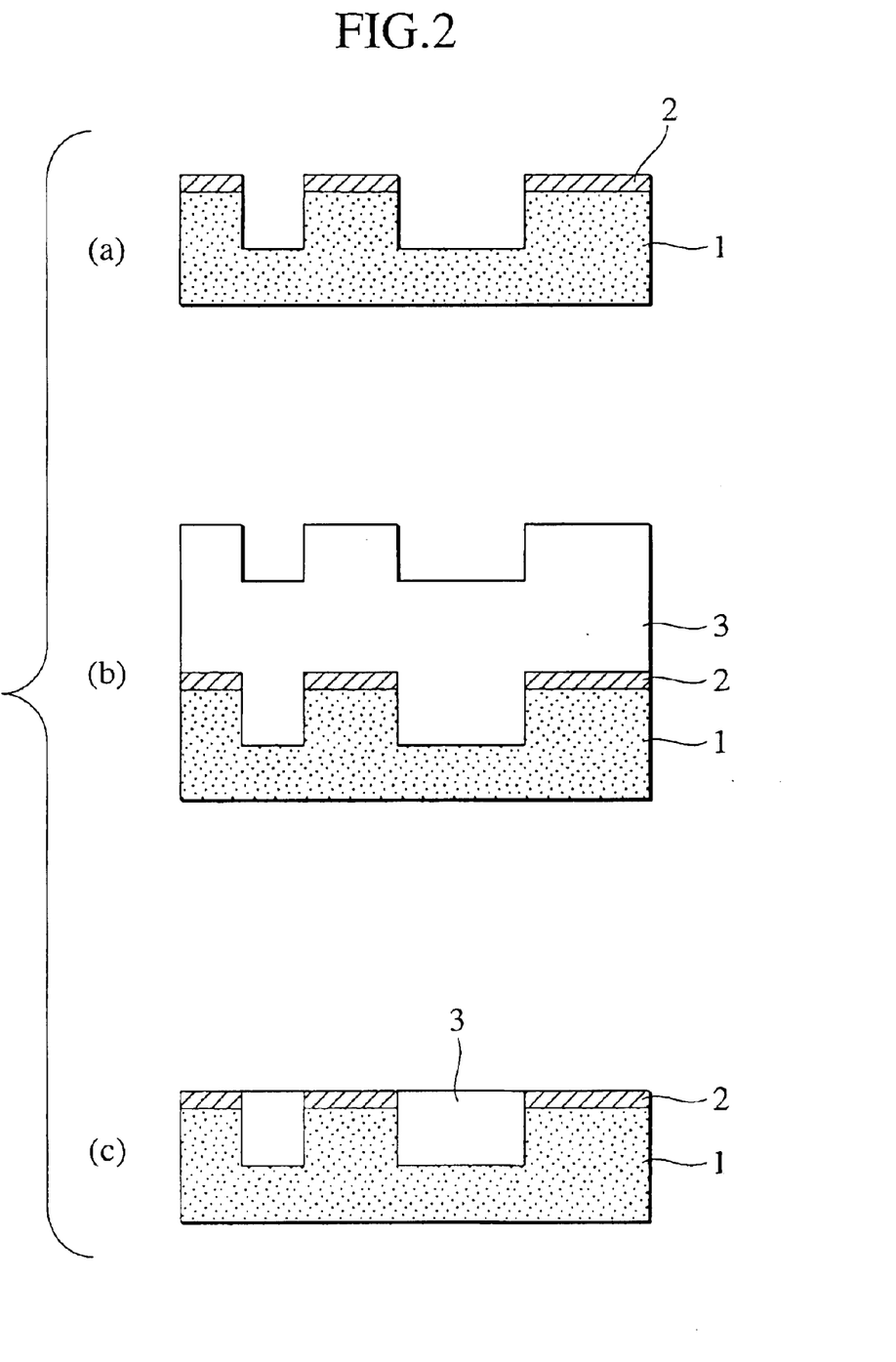
FIG. 2 is a schematic cross sectional diagram showing an example of a polishing process of a semiconductor substrate to which the present invention can be applied, wherein (a) illustrates a step where trenches were formed on a silicon substrate, (b) illustrates a step where a silicon oxide film was embedded in the trenches of (a), and (c) illustrates a step where the silicon oxide film was polished so as to separate a device.

FIGS. 2(a) to 2(c) are schematic cross sectional diagrams showing an example of a polishing process of a semiconductor substrate to which the present invention can be applied. FIG. 2(a) shows a step where trenches were formed on a silicon substrate, FIG. 2(b) shows a step where a silicon oxide film was embedded in the trenches of (a), and FIG. 2(c) shows a step where the silicon oxide film was polished for device isolation.

For example, in the case of shallow trench isolation on a silicon substrate 1 in FIG. 2(a) which has a silicon nitride film 2 formed thereon and a silicon oxide film 3 embedded in trenches as shown in FIG. 2(b), the silicon oxide film layer 3 is polished to the underlying silicon nitride film layer 2 while pits and projections on the layer 3 are smoothed, thereby leaving only the silicon oxide film 3 embedded in the device isolation portions (refer to FIG. 2(c)). In this case, when a ratio between a polishing rate for silicon oxide and a polishing rate for silicon nitride which serves as a stopper is large, a process margin of polishing becomes large.

Thus, when the silicon oxide insulating film and the silicon nitride insulating film are polished by use of the polishing slurry of the present invention, a ratio between a polishing rate for the silicon oxide film and a polishing rate for the silicon nitride film is preferably 5 or larger. The above polishing rate ratio is more preferably 15 to 300, much more preferably 30 to 100.

For example, when such a polished surface treating agent as described above is contained in the polishing slurry, the silicon oxide film is negatively charged and the silicon nitride film has a zero potential in a neutral pH range, so that the polished surface treating agent is selectively adsorbed to the silicon nitride film. Thereby, the silicon nitride film serves as a stopper film more effectively, such a preferable polishing rate ratio as described above is attained, and management of the polishing process is facilitated.

Further, when a dispersant is contained in the polishing slurry, the dispersant is adsorbed to particles in the polishing slurry and can improve dispersion stability by a solid stabilization effect.

In addition, to use the polishing slurry for the shallow trench isolation, it is required that it causes few scratches at the time of polishing. Furthermore, it can also be used in a step of flattening implanted metal wiring.

After the shallow trench isolation is formed on the silicon substrate by polishing as described above, a silicon oxide insulating film layer is formed, and aluminum wiring is then formed on the silicon oxide insulating film layer. Subsequently, a silicon oxide insulating film is formed on the aluminum wiring, and the silicon oxide insulating film is flattened by the above polishing method again. Then, a second aluminum wiring layer is formed on the flattened silicon oxide insulating film layer, and after formation of another silicon oxide insulating film between wires and on the wiring, pits and projections on the surface of the insulating film are smoothed by the above polishing method, thereby making the whole surface of the semiconductor substrate smooth. By repeating this procedure for a predetermined number of times, a semiconductor device having a desired number layers can be produced.

As a process for preparing an inorganic insulating film to which the present invention can be applied, a low pressure CVD process, a plasma CVD process and other processes can be used. To form a silicon oxide insulating film by the low pressure CVD process, monosilane: $SiH_4$ is used as a Si source, and oxygen: $O_2$ is used as an oxygen source. The silicon oxide insulating film is obtained by causing the $SiH_4$—$O_2$-based oxidation reaction to occur at a low temperature of not higher than about 400° C. To dope phosphorus: P so as to accomplish surface flattening by high-temperature reflowing, a $SiH_4$—$O_2$—$PH_3$-based reaction gas is preferably used. The plasma CVD process has an advantage that a chemical reaction which requires high temperatures in normal thermal equilibrium can be carried out at low temperatures. Processes of producing plasma are classified into capacitive-coupling type and inductive-coupling type. As a reaction gas, a $SiH_4$—$N_2O$-based gas using $SiH_4$ as a Si source and $N_2O$ as an oxygen source and a $TEOS$-$O_2$-based gas (TEOS-plasma CVD process) using tetraethoxysilane (TEOS) as a Si source may be used. A substrate temperature is preferably 250 to 400° C., and a reaction pressure is preferably 67 to 400 Pa. Thus, the silicon oxide insulating film may be doped with an element such as phosphorus or boron. Similarly, to form a silicon nitride film by the low pressure CVD process, dichlorosilane: $SiH_2Cl_2$ is used as a Si source, ammonia: $NH_3$ is used as a nitrogen source, and the silicon nitride film is obtained by causing the $SiH_2Cl_2$—$NH_3$-based oxidation reaction to occur at a high temperature of 900° C. As a reaction gas used in the plasma CVD process, a $SiH_4$-$NH_3$-based gas using $SiH_4$ as a Si source and $NH_3$ as a nitrogen source can be used. A substrate temperature is preferably 300 to 400° C.

The polishing slurry and polishing method of the present invention are used for polishing not only a silicon oxide film or silicon nitride film formed on a semiconductor substrate but also an inorganic insulating film such as a silicon oxide film, glass or silicon nitride formed on a wiring board having predetermined wiring, optical glass such as a photomask, lens or prism, an inorganic conductive film such as ITO, an optical integrated circuit constituted by glass and a crystalline material, an optical switching device, an optical waveguide, end faces of an optical fiber, an optical single crystal such as scintillator, a solid laser single crystal, an LED sapphire substrate for a blue laser, a semiconductor single crystal such as SiC, GaP or GaAs, a glass substrate for a magnetic disk, and a magnetic head. Further, the polishing slurry and polishing method of the present invention may also be applied to a metal film.

EXAMPLES

Hereinafter, the present invention will be further described with reference to Examples. However, the present invention shall not be limited to these Examples in any way.

Example 1
(Preparation of Polishing Slurry)

430 g of $Ce(NH_4)_2(NO_3)_6$ was dissolved in 7,300 g of pure water, and 240 g of ammonia water (25% aqueous solution) was then mixed into the resulting solution under agitation so as to obtain a suspension containing 160 g of cerium hydroxide (yellowish white). The obtained cerium hydroxide suspension was subjected to centrifugation (4,000 rpm, 5 minutes) so as to cause the suspension to undergo solid-liquid separation. The liquid was removed, and pure water was then added. Centrifugation was conducted under the above conditions again. After this procedure was repeated four times, the resulting suspension was washed. When obtained particles were measured for a specific surface area by a BET method, it was 200 $m^2/g$. 160 g of the particles and 15,840 g of pure water were mixed together, subjected to ultrasonic dispersion and then filtered by use of a 1-$\mu$m membrane filter so as to obtain a polishing slurry with a solid content of 1% by weight. When particle diameters of particles of the polishing slurry were measured by a photon correlation spectroscopy, an average particle diameter of secondary particles was 170 nm. In addition, the pH of the polishing slurry was 5.4.

(Polishing of Insulating Film Layer)

A 200-mm-$\phi$ silicon wafer on which a silicon oxide insulating film had been formed by a TEOS-plasma CVD method was set in a holder of a polishing machine to which an adsorption pad for fixing a substrate was attached. The holder was then mounted on a 600-mm-$\phi$ surface plate of the polishing machine on which a porous urethane resin pad had been stuck, such that the insulating film surface would face the surface plate, and a processing load was set at 30 kPa (306 $gf/cm^2$). While the above polishing slurry (solid content: 1 wt %) was being dripped onto the surface plate at a rate of 200 cc/min, the surface plate and the wafer were rotated at a rotational speed of 50 rpm for 2 minutes so as to polish the insulating film. The polished wafer was then rinsed well with pure water and then dried. As a result of measuring a change in film thickness between before and after the polishing by use of an optical interference-type film thickness measuring device, the change in the thickness of the silicon oxide insulating film (polishing rate: 400 nm/min) was 800 nm. Further, when the surface of the insulating film was observed by use of an optical microscope, no distinct scratches were observed.

Example 2
(Preparation of Polishing Slurry)

43 g of $Ce(NH_4)_2(NO_3)_6$ was dissolved in 7,300 g of pure water, and 24 g of ammonia water (25% aqueous solution) was then mixed into the resulting solution under agitation so as to obtain a suspension containing about 16 g of cerium hydroxide (yellowish white). The obtained cerium hydroxide suspension was subjected to centrifugation (4,000 $min^{-1}$, 5 minutes) so as to cause the suspension to undergo solid-liquid separation. The liquid was removed, and pure water was then added. The resulting solution was then exposed to ultrasound, thereby becoming a dispersion suspension. The obtained particles had a density of 4.7 $g/cm^3$ and a specific surface area of 180 $m^2/g$. The concentration of the particles in the dispersion was adjusted to 1.0% by weight and the pH of the dispersion was adjusted to 6.0 so as to obtain a polishing slurry. When an average particle diameter of secondary particles in the polishing slurry was measured by a photon correlation spectroscopy, it was 100 nm.

(Polishing of Insulating Film Layer)

Using the thus obtained polishing slurry, a silicon oxide insulating film was polished, dried and washed in the same manner as in Example 1. As a result of measuring a change in film thickness between before and after the polishing, the change in the thickness of the silicon oxide insulating film (polishing rate: 715 nm/min) was 1,430 nm. Further, when the surface of the silicon oxide insulating film was observed under an optical microscope, no distinct scratches were observed.

Example 3
(Preparation of Polishing Slurry)

430 g of $Ce(NH_4)_2(NO_3)_6$ was dissolved in 5,000 g of pure water, and 240 g of ammonia water (25% aqueous solution) was then mixed into the resulting solution under agitation so as to obtain a suspension containing about 160 g of cerium hydroxide (yellowish white). The suspension was formed into a dispersion in the same manner as in Example 2. The obtained particles had a density of 4.2 $g/cm^3$ and a specific surface area of 240 $m^2/g$. The concentration of the particles in the dispersion was adjusted to 1.0% by weight and the pH of the dispersion was adjusted to 7.3, thereby obtaining a polishing slurry. When an average particle diameter of secondary particles in the polishing slurry was measured by a photon correlation spectroscopy, it was 230 nm.

(Polishing of Insulating Film Layer)

Using the polishing slurry prepared by the above process, a silicon oxide insulating film was polished, dried and washed in the same manner as in Example 2. As a result, the change in the thickness of the silicon oxide insulating film (polishing rate: 401 nm/min) was 802 nm. Further, no distinct scratches were observed on the surface of the silicon oxide insulating film.

Example 4
(Preparation of Polishing Slurry)

430 g of $Ce(NH_4)_2(NO_3)_6$ was dissolved in 7,300 g of pure water, and 240 g of ammonia water (25% aqueous solution) was then mixed into the resulting solution under agitation so as to obtain a suspension containing about 160 g of cerium hydroxide (yellowish white). The suspension was formed into a dispersion in the same manner as in Example 2. The obtained particles had a density of 4.5 $g/cm^3$ and a specific surface area of 200 $m^2/g$. The concentration of the particles in the dispersion was adjusted to 1.0% by weight and the pH of the dispersion was adjusted to 4.9, thereby obtaining a polishing slurry. An average particle diameter of secondary particles in the polishing slurry which was measured by a photon correlation spectroscopy was 170 nm.

(Polishing of Insulating Film Layer)

Using the polishing slurry prepared by the above process, a silicon oxide insulating film was polished, washed and dried in the same manner as in Example 2. The change in the thickness of the silicon oxide insulating film (polishing rate: 280 nm/min) was 560 nm. Further, no distinct scratches were observed on the surface of the silicon oxide insulating film.

Example 5
(Preparation of Polishing Slurry)

430 g of $Ce(NH_4)_2(NO_3)_6$ was dissolved in 7,300 g of pure water, and 240 g of ammonia water (25% aqueous solution) was then mixed into the resulting solution under agitation so as to obtain a suspension containing 160 g of cerium hydroxide. The obtained cerium hydroxide suspension was subjected to centrifugation (4,000 rpm, 5 minutes) so as to cause the suspension to undergo solid-liquid separation. The liquid was removed, and pure water was then added. This procedure was repeated four times, and then the resulting suspension was washed. When an average crystallite size of cerium hydroxide particles in the suspension obtained after the washing was measured, it was 9.5 nm. Further, when the cerium hydroxide particles were measured for a specific surface area by a BET method, it was 200 m$^2$/g.

160 g of the cerium hydroxide particles and 15,840 g of pure water were mixed together, subjected to ultrasonic dispersion, and then filtered by use of a 1-$\mu$m membrane filter so as to obtain a polishing slurry. When an average particle diameter of secondary particles in the polishing slurry was measured by a photon correlation spectroscopy, it was 170 nm. In addition, the pH of the polishing slurry was 5.4.

(Polishing of Insulating Film Layer)

Using the foregoing polishing slurry (solid content: 1 wt %), a silicon oxide insulating film was polished, washed and dried in the same manner as in Example 1. As a result of measuring a change in film thickness between before and after the polishing by use of an optical interference-type film thickness measuring device, the thickness of the silicon oxide film was decreased (polishing rate: 400 nm/min) by 800 nm by the polishing. Further, when the surface of the insulating film was observed by use of an optical microscope, no distinct scratches were observed.

Example 6

(Preparation of Polishing Slurry)

50 g of Ce(NH$_4$)$_2$(NO$_3$)$_6$ was dissolved in 10 kg of pure water, and ammonia water (25% aqueous solution) was then mixed into the solution under agitation such that the pH of the solution would become about 6. Thereby, a suspension containing cerium hydroxide was obtained. The obtained cerium hydroxide suspension was subjected to centrifugation (4,000 rpm, 5 minutes) so as to cause the suspension to undergo solid-liquid separation. The liquid was removed, and pure water was then added. This procedure was repeated three more times, and then the resulting suspension was washed. When an average particle diameter (average crystallite size) of primary particles of cerium hydroxide particles in the suspension obtained after the washing was measured, it was 3.5 nm. Further, when the particles were measured for a specific surface area by a BET method, it was 220 m$^2$/g.

The concentration of the cerium hydroxide particles was adjusted to 0.2% by addition of water, and the pH of the suspension was adjusted to 6 by addition of ammonia water (25% aqueous solution). The resulting suspension was subjected to ultrasonic dispersion and then filtered by use of a 1-$\mu$m membrane filter so as to obtain a polishing slurry. When an average particle diameter of secondary particles in the polishing slurry was measured by a photon correlation spectroscopy, it was 100 nm.

(Polishing of Insulating Film Layer)

A silicon oxide insulating film was polished, washed and dried in the same manner as in Example 1 except that the above polishing slurry was used and that the surface plate and the wafer each were rotated at 75 rpm for 2 minutes. As a result of measuring a change in film thickness between before and after the polishing by use of an optical interference-type film thickness measuring device, the thickness of the silicon oxide film was decreased (polishing rate: 520 nm/min) by 1,040 nm by the polishing. In addition, when the surface of the insulating film was observed by use of an optical microscope, no distinct scratches were observed.

Example 7

(Preparation of Polishing Slurry)

430 g of Ce(NH$_4$)$_2$(NO$_3$)$_6$ was dissolved in 7,300 g of pure water, and 240 g of ammonia water (25% aqueous solution) was then mixed into the solution under agitation so as to obtain 160 g of cerium hydroxide (yellowish white). The obtained cerium hydroxide was subjected to centrifugation (4,000 rpm, 5 minutes) so as to cause the cerium hydroxide to undergo solid-liquid separation. The liquid was removed, pure water was newly added, and centrifugation was conducted under the above conditions again. This procedure was repeated four more times, followed by washing of the resulting cerium hydroxide. When a specific surface area of the obtained particles was measured by a BET method, it was 200 m$^2$/g. Then, 16 g of the particles, 1 g of N-methylpiperazine and 1,440 g of pure water were mixed together, and then commercially available nitric acid was added thereto so as to adjust the pH of the mixture to 5.4. Thereafter, the mixture was subjected to ultrasonic dispersion and then filtered by use of a 1-$\mu$m membrane filter so as to obtain a polishing slurry. When an average particle diameter of secondary particles in the polishing slurry was measured by a photon correlation spectroscopy, it was 170 nm. In addition, the pH of the polishing slurry after stored at room temperature for 4 months was 5.3.

(Polishing of Insulating Film Layer)

Using the foregoing polishing slurry (solid content: 1 wt %), a silicon oxide insulating film was polished, washed and dried in the same manner as in Example 1. As a result of measuring a change in film thickness between before and after the polishing by use of an optical interference-type film thickness measuring device, the change in the thickness of the silicon oxide insulating film was 800 nm (polishing rate: 400 nm/min). Further, when the surface of the insulating film after the polishing was observed by use of an optical microscope, no distinct scratches were observed.

Example 8

(Preparation of Polishing Slurry)

16 g of the particles obtained in Example 7 and 1,440 g of pure water were mixed together, and then commercially available ammonia water was added so as to adjust the pH of the mixture to 5.4. Thereafter, the mixture was subjected to ultrasonic dispersion and then filtered by use of a 1-$\mu$m membrane filter so as to obtain a polishing slurry. When a specific surface area of the obtained particles and an average particle diameter of secondary particles in the polishing slurry were measured in the same manner as in Example 7, the specific surface area was 200 m$^2$/g, and the average particle diameter of secondary particles was 200 nm. Further, the pH of the polishing slurry after stored at room temperature for 4 months was reduced to 4.5. When polishing of a silicon oxide insulating film was conducted in the same manner as in Example 7, a change in the thickness of the silicon oxide insulating film was 600 nm (polishing rate: 300 nm/min). Further, when the surface of the insulating film after the polishing was observed by use of an optical microscope, no distinct scratches were observed.

Example 9

(Preparation of Polishing Slurry)

430 g of Ce(NH$_4$)$_2$(NO$_3$)$_6$ was dissolved in 7,300 g of pure water, and 240 g of ammonia water (25% aqueous solution) was then mixed into the solution under agitation so as to obtain a suspension containing 160 g of cerium hydroxide (yellowish white). The obtained cerium hydroxide suspension was subjected to centrifugation (4,000 rpm, 5 minutes) so as to cause the suspension to undergo solid-liquid separation. The liquid was removed, pure water was newly added, and centrifugation was conducted under the above conditions again. This procedure was repeated three more times, followed by washing of the resulting suspension. When a specific surface area of particles in the cerium hydroxide suspension obtained after the washing was measured by a BET method, it was 200 m$^2$/g.

Then, 16 g of the particles in the cerium hydroxide suspension, 1.5 g of polyoxyethylene octylamine (number average molecular weight: 10,000) and 1,440 g of pure water were mixed together and then subjected to ultrasonic dispersion. Thereafter, 3 g of malic acid was added to the mixture, and the pH of the resulting mixture was adjusted to 5.4 by addition of commercially available ammonia water. Then, after subjected to ultrasonic dispersion again, the mixture was filtered with a 1-μm membrane filter so as to obtain a polishing slurry. When an average particle diameter of secondary particles in the obtained polishing slurry was measured by a photon correlation spectroscopy, it was 115 nm.

(Polishing of Insulating Film Layer)

By use of the polishing slurry (solid content: 1 wt %) prepared above, a silicon oxide insulating film was polished, washed and dried in the same manner as in Example 1. As a result of measuring a change in film thickness between before and after the polishing by use of an optical interference-type film thickness measuring device, the silicon oxide film after the polishing showed a decrease in film thickness of 760 nm (polishing rate: 380 nm/min). Further, when the polished surface of the silicon oxide insulating film was observed by use of an optical microscope, no distinct scratches were observed.

Example 10

(Preparation of Polishing Slurry)

430 g of Ce(NH$_4$)$_2$(NO$_3$)$_6$ was dissolved in 7,300 g of pure water, and 240 g of ammonia water (25% aqueous solution) was then mixed into the solution under agitation so as to obtain a suspension containing 160 g of cerium hydroxide (yellowish white). The obtained cerium hydroxide suspension was subjected to centrifugation (4,000 rpm, 5 minutes) so as to cause the suspension to undergo solid-liquid separation. The liquid was removed, pure water was newly added, and centrifugation was conducted under the above conditions again. This procedure was repeated three more times, followed by washing of the resulting suspension. When a specific surface area of particles in the cerium hydroxide suspension obtained after the washing was measured by a BET method, it was 200 m$^2$/g.

Then, 16 g of the particles in the cerium hydroxide suspension, 6 g of polyvinyl alcohol (number average molecular weight: 60,000, degree of saponification: 96%) and 1,440 g of pure water were mixed together and then subjected to ultrasonic dispersion. Then, the pH of the mixture was adjusted to 5.4 by addition of commercially available ammonia water. Then, after subjected to ultrasonic dispersion, the mixture was filtered by use of a 1-μm membrane filter so as to obtain a polishing slurry. When an average particle diameter of secondary particles in the obtained polishing slurry was measured by a photon correlation spectroscopy, it was 170 nm.

(Polishing of Insulating Film Layer)

By use of the polishing slurry (solid content: 1 wt %) prepared above, a silicon oxide insulating film was polished, washed and dried in the same manner as in Example 1. As a result of measuring a change in film thickness between before and after the polishing by use of an optical interference-type film thickness measuring device, the silicon oxide film after the polishing showed a decrease in film thickness of 800 nm (polishing rate: 400 nm/min).

Meanwhile, when a 200-mm-φ silicon wafer on which a silicon nitride insulating film had been formed by a low pressure CVD process was prepared and polished in the same manner as in Example 1, the silicon nitride insulating film showed a decrease in film thickness of 20 nm (polishing rate: 10 nm/min). Thus, the ratio between the polishing rate for the silicon oxide insulating film and the polishing rate for the silicon nitride insulating film was 40. Further, when the polished surfaces of the silicon oxide insulating film and the silicon nitride insulating film were observed by use of an optical microscope, no distinct scratches were observed.

Example 11

A polishing slurry was prepared in the same manner as in Example 10 except that a polyvinyl pyrrolidone (number average molecular weight: about 20,000) was used in place of the polyvinyl alcohol and 1.5 g of polyoxyethylene octylamine (number average molecular weight: about 10,000) was added. A specific surface area of particles in the polishing slurry was 220 m$^2$/g, and an average particle diameter of secondary particles in the polishing slurry was 125 nm. Using this polishing slurry, a silicon oxide film formed on a surface of a silicon wafer by a TEOS-CVD process and a silicon nitride insulating film formed on a surface of a silicon wafer by a low pressure CVD process were polished in the same manner as in Example 10. After 2-minute polishing, the change in the thickness of the silicon oxide insulating film was 760 nm (polishing rate: 380 nm/min), and the change in the thickness of the silicon nitride insulating film was 22 nm (polishing rate: 11 nm/min).

Further, no distinct scratches were observed on surfaces of the silicon oxide insulating film and the silicon nitride insulating film.

Example 12

(Preparation of Polishing Slurry)

200 g of Ce(NH$_4$)$_2$(NO$_3$)$_6$ was dissolved in 18 kg of pure water, and ammonia water (25% aqueous solution) was then mixed into the solution under agitation so as to obtain a suspension containing cerium hydroxide. The obtained cerium hydroxide suspension was subjected to centrifugation (4,000 rpm, 5 minutes) so as to cause the suspension to undergo solid-liquid separation. The liquid was removed, and pure water was then added. This washing procedure was repeated two more times. When a specific surface area of cerium hydroxide particles in the suspension obtained after the washing was measured by a BET method, it was 190 m$^2$/g. After the concentration of the cerium hydroxide particles was adjusted to 1.3% by addition of water, the resulting suspension was subjected to ultrasonic dispersion and then filtered with a 1-μm membrane filter so as to obtain a polishing slurry. When an average particle diameter of secondary particles in the polishing slurry was measured by a photon correlation spectroscopy, it was 105 nm.

Further, light transmittances of the polishing slurry at wavelengths of 500 nm, 600 nm and 700 nm were 22.3%, 49.5% and 68.5%, respectively. In addition, its light transmittances at wavelengths of 500 nm, 600 nm and 700 nm after the polishing slurry was left to stand for 24 hours were 24.7%, 53.9% and 73.7%, respectively (differences were 2.4%, 4.4% and 5.2%, respectively).

(Polishing of Insulating Film Layer)

A silicon oxide insulating film was polished, washed and dried in the same manner as in Example 1 except that the above polishing slurry was used and that the surface plate and the wafer each were rotated at 75 rpm for 2 minutes. As a result of measuring a change in film thickness between before and after the polishing by use of an optical interference-type film thickness measuring device, the thickness of the silicon oxide film was decreased (polishing rate: 420 nm/min) by 840 nm by the polishing. Further, when the surface of the insulating film was observed by use of an optical microscope, no distinct scratches were observed.

Example 13
(Preparation of Polishing Slurry)

1 kg of $Ce(NH_4)_2(NO_3)_6$ was dissolved in 18 kg of pure water, and ammonia water (25% aqueous solution) was then mixed into the solution under agitation so as to obtain a suspension containing cerium hydroxide. The obtained cerium hydroxide suspension was subjected to centrifugation (4,000 rpm, 5 minutes) so as to cause the suspension to undergo solid-liquid separation. The liquid was removed, and pure water was then added. This washing procedure was repeated three more times.

When a specific surface area of cerium hydroxide particles in the suspension obtained after the washing was measured by a BET method, it was 180 $m^2/g$. After the concentration of the cerium hydroxide particles was adjusted to 0.2% by addition of water, the suspension was subjected to ultrasonic dispersion and then filtered with a 1-$\mu$m membrane filter so as to obtain a polishing slurry. When an average particle diameter of secondary particles in the polishing slurry was measured by a photon correlation spectroscopy, it was 210 nm.

Further, light transmittances of the polishing slurry at wavelengths of 500 nm, 600 nm and 700 nm were 14.4%, 32.7% and 48.1%, respectively. In addition, its light transmittances at wavelengths of 500 nm, 600 nm and 700 nm after the polishing slurry was left to stand for 24 hours were 24.1%, 47.9% and 65.2%, respectively (differences were 9.7%, 15.2% and 17.1%, respectively).

(Polishing of Insulating Film Layer)

A silicon oxide insulating film was polished, washed and dried in the same manner as in Example 12 except that the above polishing slurry was used. As a result of measuring a change in film thickness between before and after the polishing by use of an optical interference-type film thickness measuring device, the thickness of the silicon oxide film was decreased (polishing rate: 400 nm/min) by 800 nm by the polishing. Further, when the surface of the insulating film was observed by use of an optical microscope, no distinct scratches were observed.

Example 14
(Preparation of Polishing Slurry)

100 g of $Ce(NH_4)_2(NO_3)_6$ was dissolved in 18 kg of pure water, and ammonia water (25% aqueous solution) was then mixed into the solution under agitation so as to adjust the pH of the solution to 5.5. Thereby, a suspension containing cerium hydroxide was obtained. The obtained cerium hydroxide suspension was subjected to centrifugation (4,000 rpm, 5 minutes) so as to cause the suspension to undergo solid-liquid separation. The liquid was removed, and pure water was then added. This procedure was repeated two more times so as to wash the suspension. When a specific surface area of cerium hydroxide particles in the suspension obtained after the washing was measured by a BET method, it was 180 $m^2/g$.

The concentration of the cerium hydroxide particles was adjusted to 0.2% by addition of water, and the pH of the suspension was adjusted to 5.5 by addition of ammonia water (25% aqueous solution). Then, the suspension was subjected to ultrasonic dispersion and then filtered with a 1-$\mu$m membrane filter so as to obtain a polishing slurry. When an average particle diameter of secondary particles in the polishing slurry was measured by a photon correlation spectroscopy, it was 130 nm. When conductivity of the polishing slurry was measured by use of a conductivity measuring device CM-20 manufactured by Toa Denshi Kogyo Co., Ltd., it was 0.5 mS/cm. When the zeta potential of the cerium hydroxide particles was measured by use of ZETA SIZER 3000HS measuring devise manufactured by Malvern Instruments, Ltd. in accordance with a laser Doppler method, it was 35 mV. In addition, neither agglomeration nor settling was seen.

(Polishing of Insulating Film Layer)

A silicon oxide insulating film was polished, washed and dried in the same manner as in Example 1 except that the above polishing slurry was used and that the surface plate and the wafer each were rotated at 75 rpm for 2 minutes. As a result of measuring a change in film thickness between before and after the polishing by use of an optical interference-type film thickness measuring device, the thickness of the silicon oxide film was decreased (polishing rate: 440 nm/min) by 880 nm by the polishing. Further, when the surface of the insulating film was observed by use of an optical microscope, no distinct scratches were observed.

Example 15
(Preparation of Polishing Slurry)

55 g of $Ce(NH_4)_2(NO_3)_6$ was dissolved in 10 kg of pure water, and ammonia water (25% aqueous solution) was then added to the solution so as to adjust the pH of the solution to 5.5. Thereby, a suspension containing 21 g of cerium hydroxide was obtained. The obtained cerium hydroxide suspension was subjected to centrifugation (4,000 rpm, 5 minutes) so as to cause the suspension to undergo solid-liquid separation. The liquid was removed, and pure water was then added. This procedure was repeated three more times so as to wash the suspension. When a specific surface area of particles in the cerium hydroxide suspension obtained after the washing was measured by a BET method, it was 200 $m^2/g$.

After the pH of the cerium hydroxide suspension (having a cerium hydroxide content of about 0.2 wt %) was adjusted to 5.5 by addition of ammonia water (25% aqueous solution), the suspension was subjected to ultrasonic dispersion and then filtered by use of a 1-$\mu$m membrane filter so as to obtain a polishing slurry. When an average particle diameter of secondary particles in the obtained polishing slurry was measured by a photon correlation spectroscopy, it was 100 nm.

(Polishing of Insulating Film Layer)

A silicon oxide insulating film was polished, washed and dried in the same manner as in Example 1 except that the above polishing slurry and a non-foamed polyurethane polishing pad having a Shore D hardness of 69 were used and that the surface plate and the wafer each were rotated at 75 rpm for 2 minutes. As a result of measuring a change in film thickness between before and after the polishing by use of an optical interference-type film thickness measuring device, the thickness of the silicon oxide insulating film was decreased (polishing rate: 425 nm/min) by 850 nm by the polishing. Further, when the surface of the insulating film was observed by use of an optical microscope, no distinct scratches were observed.

Comparative Example 1
(Preparation of Polishing Slurry)

2 kg of cerium carbonate hydrate was baked at 800° C. so as to obtain cerium hydroxide. The cerium hydroxide and pure water were mixed together and then milled and dispersed by a bead mill. Thereafter, the mixture was filtered with a 1-$\mu$m membrane filter so as to obtain a dispersion. Particles had a density of 7.0 g/cm$^3$ and a specific surface area of 280 m$^2$/g. The concentration of the particles in the dispersion was adjusted to 1.0 wt % and the pH of the dispersion was adjusted to 9.1 so as to obtain a polishing slurry. When an average particle diameter of secondary particles in the polishing slurry was measured by a photon correlation spectroscopy, it was 200 nm. When light transmittances of the polishing slurry were measured in the same manner as in Example 12 and 13, they were about 0% regardless of wavelengths. When conductivity of the polishing slurry and zeta potential of the cerium hydroxide particles were measured in the same manner as in Example 14, conductivity was 31 mS/cm, zeta potential was −50 mV.

(Polishing of Insulating Film Layer)

By use of the polishing slurry prepared by the above method, a silicon oxide insulating film was polished, washed and dried in the same manner as in Example 2. The thickness of the silicon oxide insulating film was decreased (polishing rate: 191 nm/min) by 382 nm by the polishing, and some scratches caused by the polishing were observed.

Comparative Example 2
(Preparation of Polishing Slurry)

2 kg of cerium carbonate hydrate was baked at 350° C. so as to obtain cerium hydroxide. The cerium hydroxide and pure water were mixed together and then milled and dispersed by a bead mill. Thereafter, the mixture was filtered with a 1-$\mu$m membrane filter so as to obtain a dispersion. Particles had a density of 7.0 g/cm$^3$ and a specific surface area of 200 m$^2$/g. The concentration of the particles in the dispersion was adjusted to 1.0 wt % and the pH of the dispersion was adjusted to 7.9 so as to obtain a polishing slurry. When an average particle diameter of secondary particles in the polishing slurry was measured by a photon correlation spectroscopy, it was 320 nm.

(Polishing of Insulating Film Layer)

By use of the polishing slurry prepared by the above method, a silicon oxide insulating film was polished, washed and dried in the same manner as in Example 2. The thickness of the silicon oxide insulating film was decreased (polishing rate: 53 nm/min) by 106 nm by the polishing, and no scratches caused by the polishing were observed.

Possibility of Industrial Utilization

As described above, the polishing slurry and the method for polishing a substrate according to the present invention are suitable for use in a process of flattening a surface of a substrate by CMP, particularly a process of flattening an insulating film between layers, a process of forming shallow trench isolation, and other processes.

What is claimed is:

1. A polishing slurry comprising particles and a medium in which at least a part of the particles are dispersed, wherein the particles are made of (A) at least one of a cerium compound selected from the group consisting of cerium oxide, cerium halide and cerium sulfide and having a density of 3 to 6 g/cm$^3$ and an average particle diameter of secondary particles of 1 to 300 nm, and (B) a tetravalent metal hydroxide.

2. The polishing slurry according to claim 1, wherein the particles have a specific surface area of not smaller than 50 m$^2$/g.

3. The polishing slurry according to claim 1, wherein the particles have an average particle diameter of primary particles of not larger than 50 nm.

4. The polishing slurry according to claim 1, wherein the tetravalent metal hydroxide and has an average particle diameter of secondary particles of not larger than 300 nm.

5. The polishing slurry according to claim 1, wherein the tetravalent metal hydroxide and has a density of 3 to 6 g/cm$^3$ and an average particle diameter of secondary particles of 1 to 300 nm.

6. The polishing slurry according to claim 1, wherein the particles are made of at least one of a rare earth metal hydroxide and zirconium hydroxide.

7. The polishing slurry according to claim 6, wherein the rare earth metal hydroxide is cerium hydroxide.

8. The polishing slurry according to claim 1, wherein the particles are made of a tetravalent metal hydroxide which is obtained by mixing the tetravalent metal salt with an alkali solution.

9. The polishing slurry according to claim 1, which has a pH of 3 to 9.

10. The polishing slurry according to claim 1, wherein the medium is water.

11. The polishing slurry according to claim 1, which contains a pH stabilizer.

12. The polishing slurry according to claim 11, wherein the pH stabilizer comprises one or more constituents, and at least one of the constituents has a pKa value which falls within a 1.0 unit from the pH of the polishing slurry.

13. The polishing slurry according to claim 1, which contains a dispersant.

14. The polishing slurry according to claim 13, wherein the dispersant is selected from a water-soluble anionic dispersant, a water-soluble cationic dispersant, a water-soluble nonionic dispersant and a water-soluble amphoteric dispersant.

15. The polishing slurry according to claim 1, which contains a surface treating agent.

16. The polishing slurry according to claim 15, wherein the surface treating agent is a compound containing at least one atom having an unpaired electron in a molecular structure or a compound containing at least one of a nitrogen atom and an oxygen atom in a molecular structure.

17. The polishing slurry according to claim 1, wherein a ratio between a polishing rate for a silicon oxide insulating film and a polishing rate for a silicon nitride insulating film is at least 5.

18. The polishing slurry according to claim 1, which shows a light transmittance of not lower than 10% at a wavelength of 500 nm when the particles are contained in an amount of 0.2% by weight.

19. The polishing slurry according to claim 1, wherein a difference between light transmittance at a wavelength of 500 to 700 nm of the polishing slurry immediately after its preparation and light transmittance at a wavelength of 500 to 700 nm of the polishing slurry after it is left to stand for 24 hours is not higher than 20%.

20. The polishing slurry according to claim 1, which has a conductivity of not higher than 30 mS/cm.

21. The polishing slurry according to claim 1, wherein the particles have a positive zeta potential.

22. A method of polishing a substrate with the polishing slurry according to claim 1.

23. The method of claim 22, wherein the substrate is polished with a polishing pad having a Shore D hardness of not smaller than 50.

24. The method of claim 22, wherein the substrate is a substrate in a production process of a semiconductor device.

25. The method of claim 22, wherein a silicon oxide film formed on the substrate is polished.

26. The method of claim 22, wherein the polishing slurry which is supplied to the polishing pad on a polishing surface plate, and the substrate which comprises a silicon oxide insulating film are moved relatively to each other so as to polish the substrate.

27. The method of claim 26, wherein the silicon oxide insulating film is polished with a polishing slurry containing tetravalent metal hydroxide particles such that a polishing rate would be 200 to 2,000 nm/mm.

28. The polishing slurry according to claim 2, wherein the particles have an average particle diameter of primary particles of not larger than 50 nm.

29. The polishing slurry according to claim 28, wherein the tetravalent metal hydroxide has an average particle diameter of secondary particles of not larger than 300 nm.

30. The polishing slurry according to claim 29, wherein the tetravalent metal hydroxide has a density of 3 to 6 g/cm$^3$ and an average particle diameter of secondary particles of 1 to 300 nm.

31. The polishing slurry according to claim 30, wherein the particles are made of at least one of a rare earth metal hydroxide and zirconium hydroxide.

32. The polishing slurry according to claim 31, wherein the particles are made of a tetravalent metal hydroxide which is obtained by mixing the tetravalent metal salt with an alkali solution.

33. The polishing slurry according to claim 32, which has a pH of 3 to 9.

34. The polishing slurry according to claim 33, which contains a pH stabilizer.

35. The polishing slurry according to claim 34, which contains a dispersant.

36. The polishing slurry according to claim 35, which contains a polished surface treating agent.

37. The polishing slurry according to claim 36, wherein a ratio between a polishing rate for a silicon oxide insulating film and a polishing rate for a silicon nitride insulating film is at least 5.

38. The polishing slurry according to claim 37, which shows a light transmittance of not lower than 10% at a wavelength of 500 nm when the particles are contained in an amount of 0.2% by weight.

39. The polishing slurry according to claim 38, wherein a difference between light transmittance at a wavelength of 500 to 700 nm of the polishing slurry immediately after its preparation and light transmittance at a wavelength of 500 to 700 nm of the polishing slurry after it is left to stand for 24 hours is not higher than 20%.

40. The polishing slurry according to claim 39, which has a conductivity of not higher than 30 mS/cm.

41. The polishing slurry according to claim 40, wherein the particles have a positive zeta potential.

42. A method of polishing a substrate with the polishing slurry according to claim 41.

43. The method of claim 42, wherein the substrate is a substrate in a production process of a semiconductor device.

44. The method of claim 43, wherein a silicon oxide film formed on the substrate is polished.

* * * * *